(12) United States Patent
Eppich

(10) Patent No.: US 12,114,489 B2
(45) Date of Patent: Oct. 8, 2024

(54) VERTICAL ACCESS LINE IN A FOLDED DIGITLINE SENSE AMPLIFIER

(71) Applicant: Micron Technology, Inc., Boise, ID (US)

(72) Inventor: Anton P. Eppich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 17/540,589

(22) Filed: Dec. 2, 2021

(65) Prior Publication Data

US 2023/0180467 A1 Jun. 8, 2023

(51) Int. Cl.
| | | |
|---|---|---|
| G11C 7/00 | (2006.01) | |
| G11C 5/06 | (2006.01) | |
| G11C 11/4091 | (2006.01) | |
| H10B 12/00 | (2023.01) | |

(52) U.S. Cl.
CPC ............. H10B 12/50 (2023.02); G11C 5/063 (2013.01); G11C 11/4091 (2013.01)

(58) Field of Classification Search
CPC ...... G11C 5/063; G11C 11/4091; H10B 12/50
USPC ...................................................... 365/189.1
See application file for complete search history.

(56) References Cited

U.S. PATENT DOCUMENTS

| | | | | | |
|---|---|---|---|---|---|
| 6,137,128 | A * | 10/2000 | Holmes | ............... | H10B 12/0383 257/302 |
| 7,349,232 | B2 * | 3/2008 | Wang | .................... | G11C 7/02 365/69 |
| 7,365,385 | B2 * | 4/2008 | Abbott | ................ | H10B 12/482 257/302 |
| 7,910,971 | B2 * | 3/2011 | Lindholm | ........... | H01L 29/7827 257/E29.345 |
| 8,211,763 | B2 * | 7/2012 | Lindholm | ........... | H01L 29/7827 257/E27.084 |
| 8,441,056 | B2 * | 5/2013 | Prall | ................... | G11C 11/5692 257/302 |
| 8,497,541 | B2 * | 7/2013 | Parekh | ................... | H10B 12/00 257/302 |
| 8,617,953 | B2 * | 12/2013 | Juengling | ............ | H10B 12/053 257/329 |

(Continued)

FOREIGN PATENT DOCUMENTS

| | | | | | |
|---|---|---|---|---|---|
| CN | 1507035 | A * | 6/2004 | ........... | G11C 11/412 |
| EP | 940853 | A2 * | 9/1999 | ....... | H01L 27/10841 |

(Continued)

*Primary Examiner* — Viet Q Nguyen
(74) *Attorney, Agent, or Firm* — Brooks, Cameron & Huebsch, PLLC

(57) ABSTRACT

The present disclosure includes apparatuses and methods for vertical access line in a folded digitline sense amplifier. An example apparatus includes an array of memory cells. The memory cells form active areas having adjacent access devices, each access device having a first source/drain region and a second source/drain region separated by a channel region and a gate opposing the channel region. A pair of adjacent memory cells can share a digitline contact at the second source/drain region. A storage node contact can be coupled to respective first source/drain regions and each gate can be connected to vertically oriented access lines formed on opposing side of a depletion region to each access device. An insulator material can be patterned between adjacent digitlines to isolate adjacent memory cells.

18 Claims, 5 Drawing Sheets

(56) References Cited

U.S. PATENT DOCUMENTS

| | | | |
|---|---|---|---|
| 8,686,497 B2 * | 4/2014 | Kwon | H01L 29/7841 |
| | | | 438/270 |
| 9,355,736 B1 * | 5/2016 | Ratnam | G11C 16/3427 |
| 10,424,656 B2 * | 9/2019 | Juengling | H01L 29/66795 |
| 10,607,995 B2 | 3/2020 | Roberts et al. | |
| 11,049,804 B2 * | 6/2021 | Ramaswamy | H01L 23/5225 |
| 11,659,716 B2 * | 5/2023 | Juengling | H01L 29/78642 |
| | | | 257/295 |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2021/0013226 A1 | 1/2021 | Tang et al. | |
| 2022/0246622 A1 * | 8/2022 | Benson | H10B 12/315 |

FOREIGN PATENT DOCUMENTS

| | | | | |
|---|---|---|---|---|
| JP | 2011254062 A * | 12/2011 | | H01L 27/10826 |
| WO | WO-2011031749 A2 * | 3/2011 | | H01L 27/108 |

\* cited by examiner

VERTICAL ACCESS LINE IN A FOLDED DIGITLINE SENSE AMPLIFIER

TECHNICAL FIELD

The present disclosure relates generally to semiconductor memory and methods, and more particularly, to apparatuses and methods for memory arrays with vertical access lines in a folded digitline sense amplifier.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

DETAILED DESCRIPTION

Figure 1A:
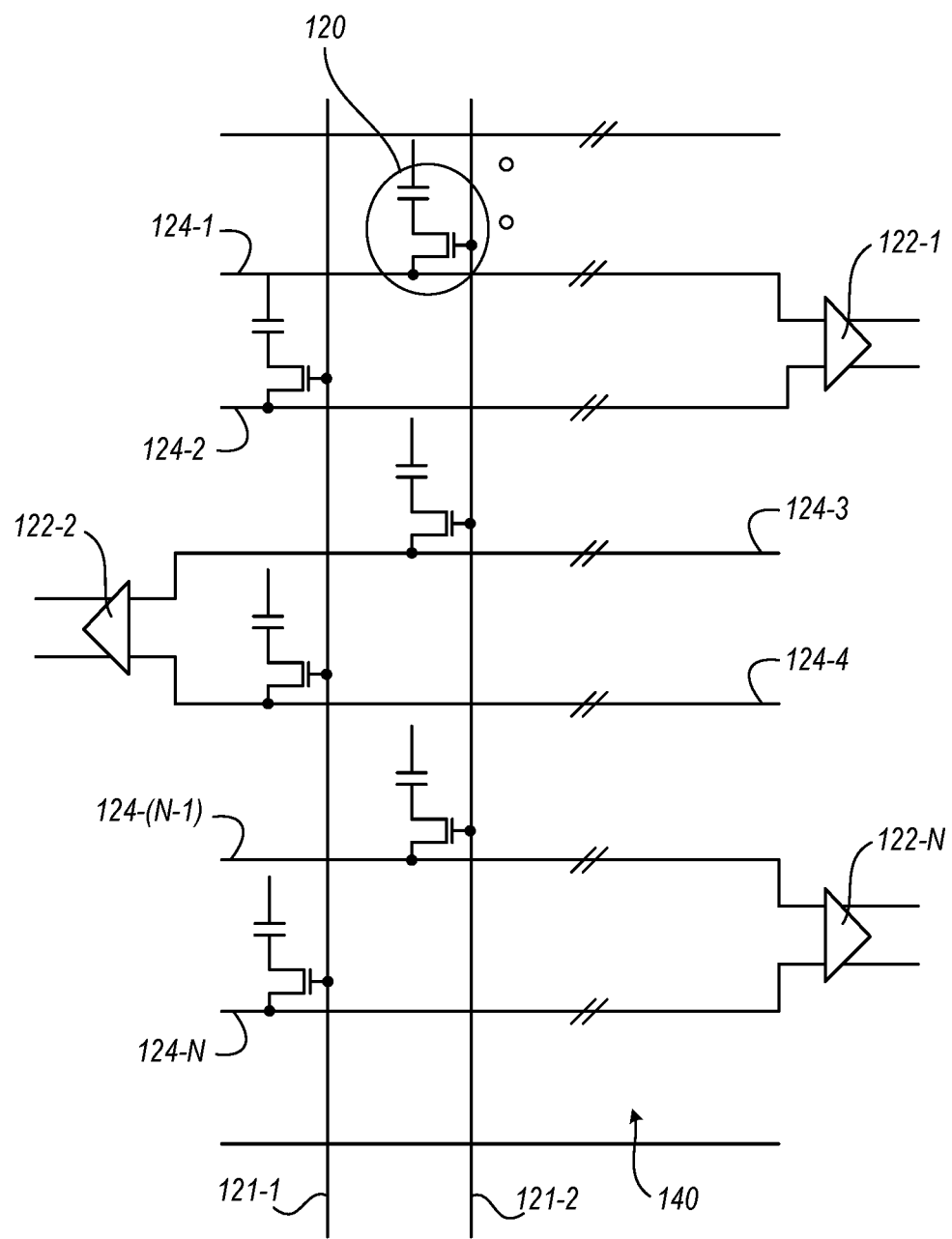
FIG. 1A is an illustration of an array of memory cells having a folded digitline architecture in accordance with a number of embodiments of the present disclosure.

The present disclosure includes apparatuses and methods for vertical access lines in a folded digitline sense amplifier. In at least one embodiment, an example apparatus includes an array of memory cells. The memory cells form active areas having adjacent access devices, each access device having a first source/drain region and a second source/drain region separated by a channel region and a gate opposing the channel region. A pair of adjacent memory cells share a digitline contact at the second source/drain region. A storage node is coupled to each of the respective first source/drain regions and each gate is connected to vertically oriented access lines formed on opposing side of a depletion region of each access device. A sense amplifier is coupled to each pair of digitlines in the array according to a folded digitline sense amplifier architecture. An insulator can be material patterned between adjacent digitlines to isolate adjacent memory cells. The memory cells described herein are dynamic random access memory (DRAM) cells.

An open digitline sense amplifier architecture compares the voltages from a cell to a reference digitline from a separate subarray. This increases the opportunity for additional noise and/or interferences during the comparison in the sensing process. The additional noise can reduce the signal strength received during the sensing process. Also, improving sense amplifier performance is a significant issue to overcome as DRAM cell sizes get smaller.

As described in more detail below, the present disclosure allows a $4F^2$ cell in a folded digitline sense amplifier architecture. For example, the memory cells may include two lithographic features (2F) on a vertical axis crossed with two lithographic features on a horizontal axis to produce the memory cell within four lithographic features squared ($4F^2$). This allows adjacent word lines to cross every other active area. For example, each vertically oriented access line may pass over alternating active areas such that each vertically oriented access line activates one memory cell of the pair of adjacent memory cells. The other memory cell of the pair of adjacent memory cells may remain as a reference. As such, one of the adjacent digitlines may remain at a reference voltage. The digitline reading out from a memory cell may compare to an adjacent reference digitline and remain undisturbed by the sensing process. This folded digitline sense amplifier architecture can improve the sensing ability of the sense amplifier and enables efficient use of space within the memory cell due to the DRAM cell size of $4F^2$.

The digitlines are approximately orthogonal to the wordlines forming the vertical gates of the memory cells and the digitline contact can be adjacent to the depletion region of the memory cells' access devices. A vertical gate can be formed by the vertically oriented access lines (e.g., wordlines) on opposite sides of a depletion region for each access device. The vertical gate controls current flow between the digitline contact and the storage device. The vertical gate can have an aspect ratio (AR) of the height to width being in a range of from 5:1 to 15:1. The vertical gate can be formed above an active area of the memory cell and on a sidewall of a depletion region of the memory cell. The active area of each memory cell can be at an angle between 20° and 65° with respect to the digitline. Each successive active area is alternately angled relative to an adjacent active area along each wordline. The vertically oriented access lines and gates can be formed using atomic layer deposition (ALD) techniques. An insulator can be formed between adjacent digitlines to isolate adjacent memory cells and keep adjacent memory cells from shorting through the depletion region.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 121 may reference element "21" in FIG. 1A, and a similar element may be referenced as 221 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is an illustration of an array of memory cells having a folded digitline architecture in accordance with a number of embodiments of the present disclosure. In FIG. 1A, an array of memory cells includes a number of memory cells 120, each including a storage container shown as a capacitor in FIG. 1A and an access device shown in as a transistor in FIG. 1A, in a folded digitline architecture. The array of memory cells 140 includes access lines 121-1 and 121-2 coupled to gates of the memory cells and digitlines 124-1, 124-2, 124-3, 124-4, 124-(N–1), and 124-N coupled to source/drain regions of the access devices of the memory cells. Each pair of digitlines are coupled to a sense amplifier in a folded digitline architecture, where digitlines 124-1 and 124-2 are coupled to sense amplifier 122-1, digitlines 124-3 and 124-4 are coupled to sense amplifier 122-2, and digitlines 124-(N–1) and 124-N are coupled to sense amplifier 122-N.

The array of memory cells 140 is configured such that each access line 121-1 and 121-2 is coupled to memory cells that are coupled to every other digitline. For example, access line 121-1 is coupled to memory cells that are coupled to digitlines 124-2, 124-4, and 124-N and access line 121-2 is coupled to memory cells that are coupled to digitlines 124-1, 124-3, and 124-(N–1). This configuration allows, in the folded digitline architecture, for adjacent digit lines to be the reference signal when sensing memory cells in the array of memory cells 140. For example, when sensing the memory cell coupled to digitline 124-1 and access line 121-2, the digitline 124-2 can provide the reference signal to sense amp 122-1, due to digitline 124-2 not be coupled to a memory cell on access line 121-2.

Figure 1B:
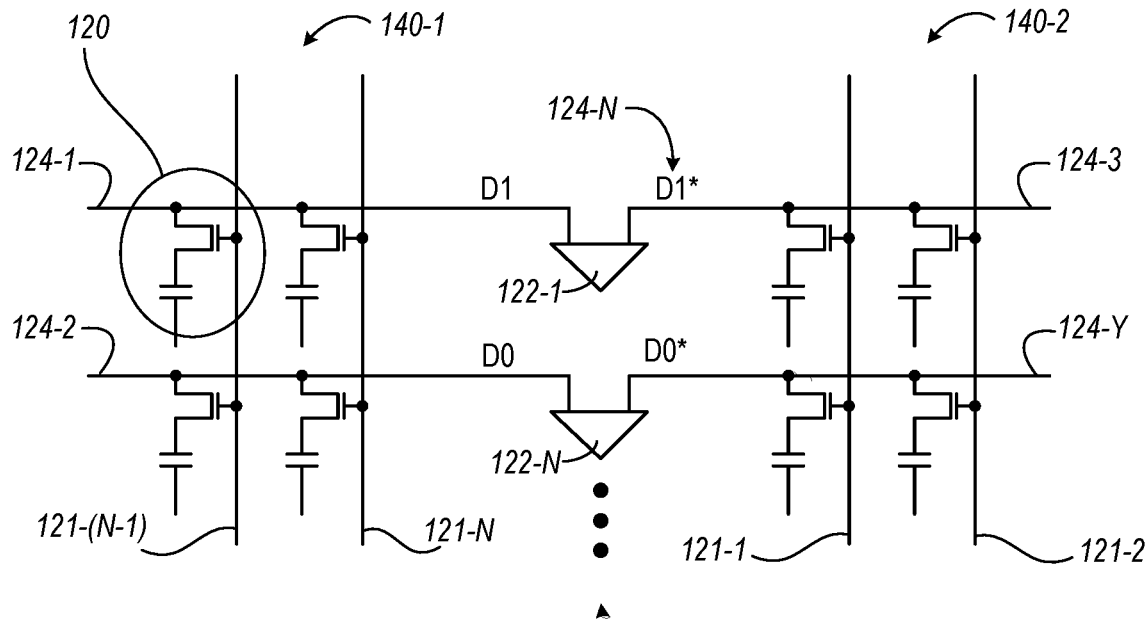
FIG. 1B is an illustration of an array of memory cells having an open digitline architecture.

FIG. 1B is an illustration of arrays of memory cells having an open digitline architecture. In FIG. 1B, arrays of memory cells 140-1 and 140-2 includes a number of memory cells 120, each including a storage container shown as a capacitor in FIG. 1B and an access device shown in as a transistor in FIG. 1B, in an open digitline architecture. The array of memory cells 140-1 includes access lines 121-N and 121-(N–1) coupled to gates of the memory cells and digitlines 124-1 and 124-2 coupled to source/drain regions of the access devices of the memory cells. The array of memory cells 140-2 includes access lines 121-1 and 121-2 coupled to gates of the memory cells and digitlines 124-3 and 124-Y coupled to source/drain regions of the access devices of the memory cells. In an open digitline architecture, each digitline is coupled to each memory cell in a row and each sense amplifier is coupled to a digitline from adjacent arrays of memory cells. For example, sense amplifier 122-1 is coupled to digitline 124-1 in array 140-1 and digitline 124-2 in array 140-2 and sense amplifier 122-N is coupled to digitline 124-2 in array 140-1 and digitline 124-2Y in array 140-2.

In the open digitline architecture in FIG. 1B, when sensing memory cells in the array 140-1 the reference signal is from array 140-2; and when sensing memory cells in the array 140-2 the reference signal is from array 140-1. For example, when sensing the memory cells coupled to digitline 124-1 in array 140-1, digitline 124-3 can provide the reference signal to sense amp 122-1.

Figure 2:
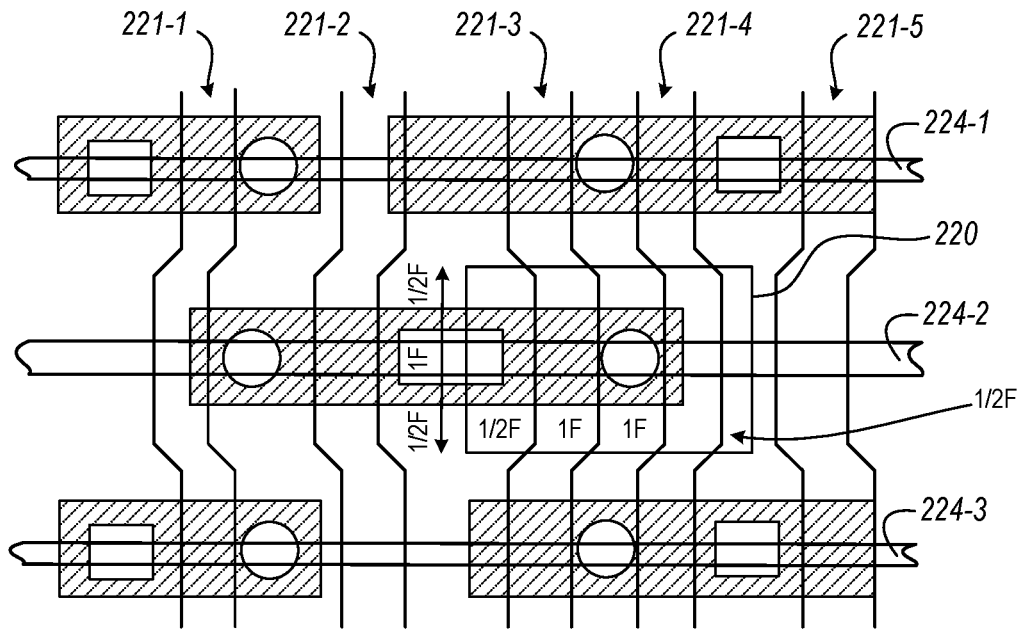
FIG. 2 is a schematic diagram illustrating an array of memory cells with each memory cell having a size of six lithographic features squared ($6F^2$).

FIG. 2 is a schematic diagram illustrating an array of memory cells with six lithographic features squared ($6F^2$). The vertically oriented access lines 221 may be analogous or similar to access lines 121 of FIGS. 1A and 1B. Digitlines 224 may be analogous or similar to digitlines 124 of FIGS. 1A and 1B. Memory cell 220 may be analogous or similar to memory cell 120 of FIGS. 1A and 1B.

As shown in the example embodiment of FIG. 2, a memory cell 220 may be located within six lithographic features squared ($6F^2$). As used herein, F refers to the minimum lithographic feature size for a cell area. For example, the memory cell 220 may include three lithographic features (3F) on a vertical axis crossed with two lithographic features (2F) on a horizontal axis to produce the memory cell within $6F^2$. The vertical axis as illustrated may include two half a lithographic feature (½ F) and 2 lithographic features. The horizontal axis may include two ½ Fs and one lithographic feature.

In this embodiment, each vertically oriented access line 221 (e.g., access line 221-1, access line 221-2, . . . , access line 221-5) is formed at a 90° angle to an oriented of each active area. The digitlines 224 (e.g., digitline 224-1, 224-2, and 224-3) may pass through each active area. As such the vertically oriented access lines 221 may form a 90° angle to the digitlines 224.

The sense amplifier in this embodiment may be a folded digitline sense amplifier architecture and the access lines are formed so they are not in a straight vertical line, but are formed to shift to avoid the access devices of memory cells in every other row. For example, access lines 221-1 and 221-2 are configured to contact access devices in memory cells coupled to digitlines 224-1 and 224-3, but are shifted to avoid contacting access devices in memory cells coupled to digitline 224-2. This shifting of the access lines allows for a folded digitline architecture by allowing adjacent digitlines to provide a reference signal when sensing memory cells coupled to a particular digitline, but the shift also adds 1 F to the horizontal dimension of each memory cell, causing the memory cells in FIG. 2 to have a size of $6F^2$.

Figure 3:
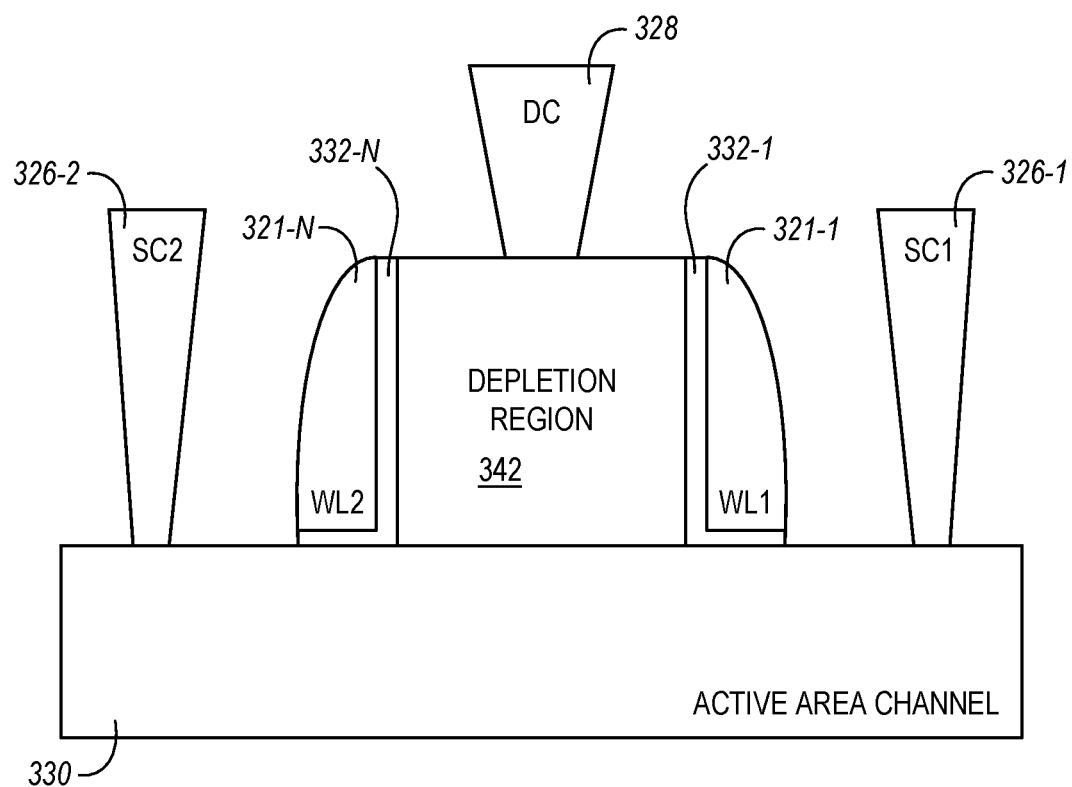
FIG. 3 illustrates a cross-section of a portion of a memory cell array in accordance with a number of embodiments of the present disclosure.

FIG. 3 illustrates a cross-section of a portion of an array of memory cells in accordance with a number of embodiments of the present disclosure. FIG. 3 shows vertically oriented access lines 321 (e.g., access line 321-1 and access line 321-N) each coupled to a respective pair of gate oxide 332 (e.g., gate oxide 332-1 and gate oxide 332-N). The vertically oriented access lines 321 may be analogous or similar to access lines 121 and 221 of FIGS. 1A and 1B and 2 respectively.

The vertically oriented access lines 321 may be formed on opposing sides of depletion region 342. A digitline contact 328 may be located adjacent the depletion region 342. For example, the digitline contact 328 may be located above the depletion region 342. The depletion region 342 may be flanked by the pair of vertically oriented access lines 321 and insulator 332 (e.g., a gate oxide) may be formed between the depletion region 342 and the vertically oriented access lines 321.

The gate oxide 332 may be vertically oriented above an active area 330 of the memory cell and on a sidewall of the depletion region 342 of the memory cell. Therefore, the gate 321 may also be vertically formed above the active area 330 of the memory cell and on a sidewall of the depletion region 342 of the memory cell. The gate may be connected to and/or formed from the vertically oriented access lines 321, on opposing sides of the depletion region 342. In FIG. 3, a first memory cell of the pair of memory cells includes storage container contact 326-1 and a storage container (e.g., capacitor, not shown) formed above the storage container contact 326-1. Each memory cell of the pair of memory cells includes an access device. Each pair of memory cells may share the digitline contact 328 that is coupled to the depletion region 342. A first memory cell includes a first access device comprising a gate formed of access line 321-1, an insulator 332-1, a first source/drain and a second source drain region separated by a channel region. The channel region of the first access device is formed in the active area 330 and depletion region 342 between the first source/drain coupled to the digitline contact 328 and the second source/drain coupled to the storage container contact 326-1. A second memory cell includes a second access device comprising a gate formed of access line 321-N, an insulator 332-N, a first source/drain and a second source drain region separated by a channel region. The channel region of the second access device is formed in the active area 330 and depletion region 342 between the first source/drain coupled to the digitline contact 328 and the second source/drain coupled to the storage container contact 326-2. The insulators 332-1 and 332-N may be formed opposing the channel region.

The vertically oriented access lines 321 and the gate may be formed (e.g., grown) using atomic layer deposition (ALD) techniques. The gate formed of access lines 321-1 and 321-N and insulators 332-1 and 332-N controls current flow between the digitline contact 328 and the storage container contacts 326-1 and 326-2. The insulators 332-1 and 332-N and access lines 321-1 and 321-N may be formed to a thin width to enable density and to a tall height to provide conductor volume to enable sufficient current flow. For example, the insulators 332-1 and 332-N and access lines 321-1 and 321-N may have an aspect ratio (AR) of the height to width being in a range of from 5:1 to 15:1.

Figure 4:
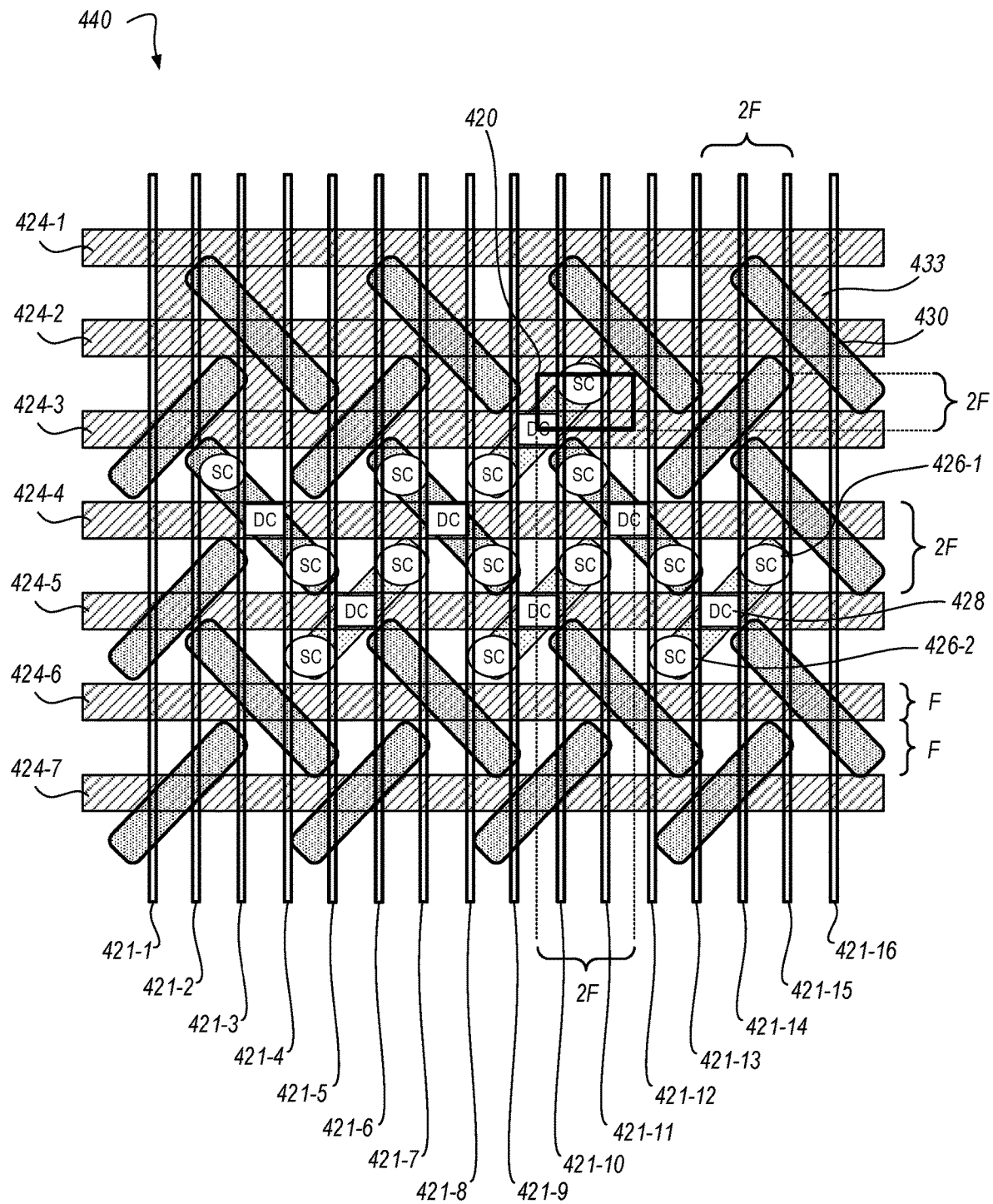
FIG. 4 is a top view of an array of memory cells having a folded digitline sense amplifier architecture in accordance with a number of embodiments of the present disclosure.

FIG. 4 is a top view of an array of memory cells having a folded digitline sense amplifier architecture in accordance with a number of embodiments of the present disclosure. The vertically oriented access lines 421 may be analogous or similar to access lines 121 and 321 of FIGS. 1A, 1B, and 3 respectively. Digitlines 424 may be analogous or similar to digitlines 124 of FIGS. 1A and 1B. Memory cells 420 may be analogous or similar to memory cells 120 of FIGS. 1A and 1B. Storage container contact 426 may be analogous or similar to storage container contacts 326 of FIG. 3. Active area 430 may be analogous or similar to active area 330 of FIG. 3. Digitline contact 428 may be analogous or similar to digitline contact 328 of FIG. 3.

In this embodiment, the memory array 440 is a DRAM array of 1T1B (one transistor one capacitor) memory cells, although other embodiments of configurations can be used (e.g., 2T2C with two transistors and two capacitors per memory cell). In the array of memory cells illustrated in FIG. 4, the memory cells 420 includes an active area 430. In the embodiment illustrated, each active area 430 contains a pair of access devices that share a digitline contact 428. Each active area 430 may be formed at an angle of a range between 40-50 degrees to an orientation of the vertically oriented access lines 421 and the digitlines 424. Successive active areas may be alternately angled relative to an adjacent active area. The digitline 424 may be approximately orthogonal to the vertical gate. For example, each active area 430 is at an angle between 20° and 65° with respect to the digitline 424.

Each access device of the pair of access devices may have a first source/drain region and a second source drain region separated by a channel region. The gate may be formed opposing the channel region. Adjacent memory cells share a digitline contact at the second source/drain region and a storage node contact 426 coupled to each first source/drain regions. An insulator material 433 may be formed in between adjacent digitlines to isolate adjacent memory cells. The insulator material 433 may be formed to protect the vertically oriented access lines 421 from leaking current between adjacent cells. The leak may occur through a shared depletion region (e.g., depletion region 342 as described in FIG. 3).

The insulator material 433 may permit a formation of each memory cell 420 within four lithographic features squared ($4F^2$). As used herein, F refers to the minimum lithographic feature size for a cell area. For example, the memory cell 420 may include two lithographic features (2F) on a vertical axis crossed with two lithographic features on a horizontal axis to produce the memory cell within $4F^2$. For example, the memory cell may be measured horizontally across two access lines and vertically across two digitlines for a total cell area of $4F^2$. The cell design allows for smaller DRAM cell size while enabling a folded digitline sense amplifier architecture. This allows for more efficient space usage within the cell.

The digitlines 424 may be coupled to a sense amplifier according to a folded digitline sense amplifier architecture. For example, the memory cell is coupled to the digitline 424 having a folded digitline sense amplifier architecture. As such, each vertically oriented access line 421 may pass over alternating active areas so that only every other digitline 424 is activated while adjacent digitlines remain at a reference voltage. For example, vertically oriented access line 421-4 may pass over alternate active areas than vertically oriented access line 421-5. Each vertically oriented access line 421 may activate one memory cell of the pair of adjacent memory cells while adjacent memory cells are kept at a reference voltage. The activated memory cell and the reference memory cell are within the same subarray to reduce signal-to-noise ratio and provide better sensing ability.

Figure 5:
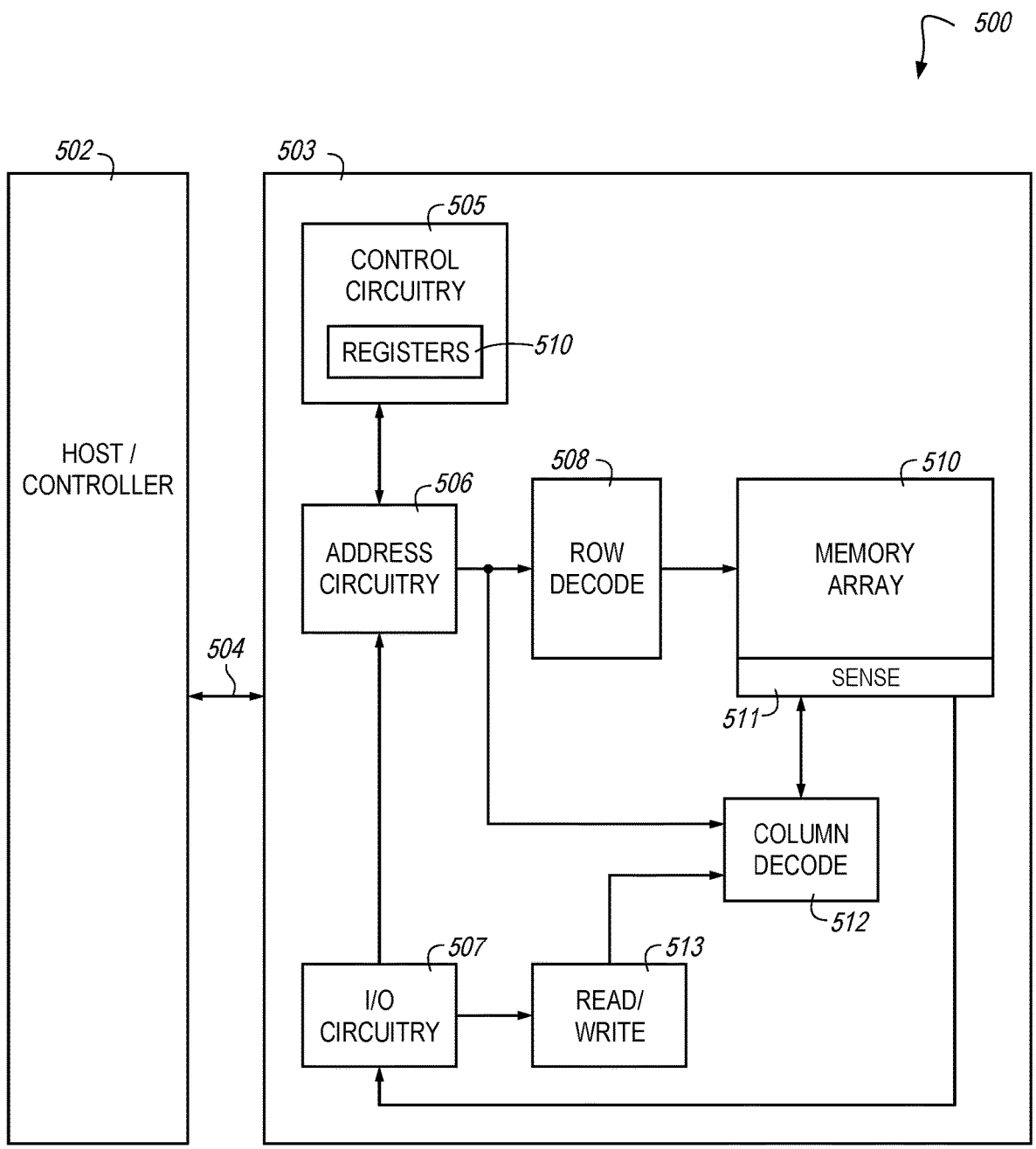
FIG. 5 is a block diagram of an apparatus in the form of a computing system including a memory device in accordance with a number of embodiments of the present disclosure.

FIG. 5 is a block diagram of an apparatus in the form of a computing system 500 including a memory device 503 in accordance with a number of embodiments of the present disclosure. As used herein, a memory device 503, a memory array 510, and/or a host 502, for example, might also be separately considered an "apparatus." According to embodiments, the memory device 502 may comprise at least one memory array 510 with a memory cell formed having a digit line and body contact, according to the embodiments described herein.

In this example, system 500 includes a host 502 coupled to memory device 503 via an interface 504. The computing system 500 can be a personal laptop computer, a desktop computer, a digital camera, a mobile telephone, a memory card reader, or an Internet-of-Things (IoT) enabled device, among various other types of systems. Host 502 can include a number of processing resources (e.g., one or more processors, microprocessors, or some other type of controlling circuitry) capable of accessing memory 503. The system 500 can include separate integrated circuits, or both the host 502 and the memory device 503 can be on the same integrated circuit. For example, the host 502 may be a system controller of a memory system comprising multiple memory devices 503, with the system controller 505 providing access to the respective memory devices 503 by another processing resource such as a central processing unit (CPU).

In the example shown in FIG. 5, the host 502 is responsible for executing an operating system (OS) and/or various applications (e.g., processes) that can be loaded thereto (e.g., from memory device 503 via controller 505). The OS and/or various applications can be loaded from the memory device 503 by providing access commands from the host 502 to the memory device 503 to access the data comprising the OS and/or the various applications. The host 502 can also access data utilized by the OS and/or various applications by providing access commands to the memory device 503 to retrieve said data utilized in the execution of the OS and/or the various applications.

For clarity, the system 500 has been simplified to focus on features with particular relevance to the present disclosure. The memory array 510 can be a DRAM array comprising at least one memory cell having a digit line and body contact formed according to the techniques described herein. For example, the memory array 510 can be a $4F^2$ array. The array 510 can comprise memory cells arranged in columns coupled by word lines (which may be referred to herein as access lines or select lines) and rows coupled by digit lines (which may be referred to herein as sense lines or data lines). Although a single array 510 is shown in FIG. 5, embodiments are not so limited. For instance, memory device 503 may include a number of arrays 510 (e.g., a number of banks of DRAM cells).

The memory device 503 includes address circuitry 506 to latch address signals provided over an interface 504. The interface can include, for example, a physical interface employing a suitable protocol (e.g., a data bus, an address bus, and a command bus, or a combined data/address/command bus). Such protocol may be custom or proprietary, or the interface 504 may employ a standardized protocol, such as Peripheral Component Interconnect Express (PCIe), Gen-Z, CCIX, or the like. Address signals are received and decoded by a row decoder 508 and a column decoder 512 to access the memory array 510. Data can be read from memory array 510 by sensing voltage and/or current changes on the sense lines using sensing circuitry 511. The sensing circuitry 511 can comprise, for example, sense amplifiers that can read and latch a page (e.g., row) of data from the memory array 510. The I/O circuitry 507 can be used for bi-directional data communication with the host 502 over the interface 504. The read/write circuitry 513 is used to write data to the memory array 510 or read data from the memory array 510. As an example, the circuitry 513 can comprise various drivers, latch circuitry, etc.

Control circuitry 505 decodes signals provided by the host 502. The signals can be commands provided by the host 502. These signals can include chip enable signals, write enable signals, and address latch signals that are used to control operations performed on the memory array 510, including data read operations, data write operations, and data erase operations. In various embodiments, the control circuitry 505 is responsible for executing instructions from the host 502. The control circuitry 505 can comprise a state machine, a sequencer, and/or some other type of control circuitry, which may be implemented in the form of hardware, firmware, or software, or any combination of the three. In some examples, the host 502 can be a controller external to the memory device 503. For example, the host 502 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

While example embodiments including various combinations and configurations of sensing circuitry, sense amplifiers, compute components, logic stripes, shared I/O lines, column select circuitry, multiplexers, latch components, latch stripes, and/or latches, etc., have been illustrated and described herein, embodiments of the present disclosure are not limited to those combinations explicitly recited herein. Other combinations and configurations of the sensing circuitry, sense amplifiers, compute components, logic stripes, shared I/O lines, column select circuitry, multiplexers, latch components, latch stripes, and/or latches, etc., disclosed herein are expressly included within the scope of this disclosure.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An apparatus, comprising:
    an array of memory cells, wherein
        the memory cells form active areas having adjacent access devices, each access device having a first source/drain region and a second source/drain region separated by a channel region and a gate opposing the channel region;
        a pair of adjacent memory cells share a digitline contact at the respective second source/drain regions and each respective storage node of the pair of adjacent memory cells is coupled to the respective first source/drain regions; and
        each gate is connected to vertically oriented access lines formed on opposing side of a depletion region to each access device;
    a sense amplifier coupled to digitlines in the array according to a folded digitline sense amplifier architecture; and
    an insulator material patterned between adjacent digitlines to isolate adjacent memory cells.

2. The apparatus of claim 1, wherein each memory cell is formed within four lithographic features squared ($4F^2$).

3. The apparatus of claim 1, wherein each active area is at an angle of a range between 40-50 degrees to an orientation of the vertically oriented access lines and the digitlines.

4. The apparatus of claim 3, wherein each successive active area is alternately angled relative to an adjacent active area.

5. The apparatus of claim 1, wherein the memory cells are dynamic random access memory (DRAM) cells.

6. The apparatus of claim 1, wherein the vertically oriented access lines and gates are formed using atomic layer deposition techniques.

7. An apparatus, comprising:
    an array of memory cells, wherein
        each memory cell is formed within four lithographic features squared ($4F^2$) according to a folded digitline sense amplifier architecture;
        the memory cells include alternately angled active areas having adjacent access devices, each access device having a first source/drain region and a second source/drain region separated by a channel region and a gate opposing the channel region;
        a pair of adjacent memory cells share a digitline contact at the respective second source/drain regions and a each respective storage node of the pair of adjacent memory cells is coupled to the respective first source/drain regions; and
        the gate is connected to vertically oriented access lines formed on opposing side of a depletion region to each access device;
    a sense amplifier coupled to digitlines in the array; and
    an insulator material formed between adjacent digitlines to separate adjacent memory cells.

8. The apparatus of claim 7, wherein the gate is a conductive spacer.

9. The apparatus of claim 7, wherein the gate controls current flow between the digitline contact and each access device.

10. The apparatus of claim 7, wherein each vertically oriented access line passes over alternating active areas.

11. The apparatus of claim 10, wherein each vertically oriented access line activates one memory cell of the pair of adjacent memory cells.

12. The apparatus of claim 10, wherein one of the adjacent digitlines remains at a reference voltage.

13. The apparatus of claim 7, wherein the gate has an aspect ratio (AR) of the height to width being in a range of from 5:1 to 15:1.

14. The apparatus of claim 7, wherein the digitline contact is adjacent the depletion region.

15. An apparatus, comprising:
    a memory cell having a size of four lithographic features squared ($4F^2$);
        wherein the memory cell includes a vertical gate opposing a channel region;
        wherein the channel region is coupled a storage node at first source/drain region and is coupled to a digitline at a second source/drain region;
        wherein an active area of the memory cell is at an angle between 20° and 65° with respect to the digitline;
        wherein an insulator material isolates the memory cell from an adjacent memory cell; and wherein the memory cell is coupled to the digitline having a folded digitline sense amplifier architecture.

16. The apparatus of claim 15, wherein the digitline is approximately orthogonal to the vertical gate.

17. The apparatus of claim 15, the memory cells include two lithographic features (2F) on a vertical axis crossed with two lithographic features on a horizontal axis to produce the memory cell within four lithographic features squared ($4F^2$).

18. The apparatus of claim 15, wherein the vertical gate is formed above an active area of the memory cell and on a sidewall of a depletion region of the memory cell.

* * * * *